United States Patent [19]

Wilcox

[11] Patent Number: 4,954,712
[45] Date of Patent: Sep. 4, 1990

[54] SPECIMEN RETAINING RING SYSTEM FOR AN ELECTRON MICROSCOPE

[76] Inventor: Harry P. Wilcox, 2761 Varsity Dr., Fairborn, Ohio 45324

[21] Appl. No.: 421,827

[22] Filed: Oct. 16, 1989

[51] Int. Cl.$^5$ .............................................. H01J 37/20
[52] U.S. Cl. .............................. 250/440.1; 250/442.1; 250/311; 269/254 R
[58] Field of Search .................. 250/440.1, 442.1, 311; 269/254 R

[56]  References Cited

U.S. PATENT DOCUMENTS

| | | | |
|---|---|---|---|
| 2,655,826 | 10/1953 | Goldsby | 269/254 R |
| 3,297,869 | 1/1967 | Ozasa et al. | 250/440.1 |
| 3,745,341 | 7/1973 | Sakitani . | |
| 4,596,934 | 10/1986 | Yanaka et al. . | |
| 4,651,009 | 3/1987 | Totsuka | 250/442.1 |

Primary Examiner—Jack I. Berman
Assistant Examiner—Kiet T. Nguyen
Attorney, Agent, or Firm—Jacox & Meckstroth

[57] ABSTRACT

A movable specimen holder for an electron microscope has a pivotal support block defining a cylindrical counterbore extending from an annular internal shoulder which supports a circular specimen grid. The grid is retained in the counterbore by a resilient split band or ring having an outer cylindrical surface for engaging the counterbore with a friction fit. The ring has a cylindrical inner surface interrupted by an annular recess or groove which is adapted to receive the outwardly projecting feet on the spring legs of a tweezers-like tool. The tool is used to insert the retaining ring into the counterbore adjacent the specimen grid and to remove the ring from the counterbore without losing the ring.

15 Claims, 1 Drawing Sheet

U.S. Patent   Sep. 4, 1990   4,954,712
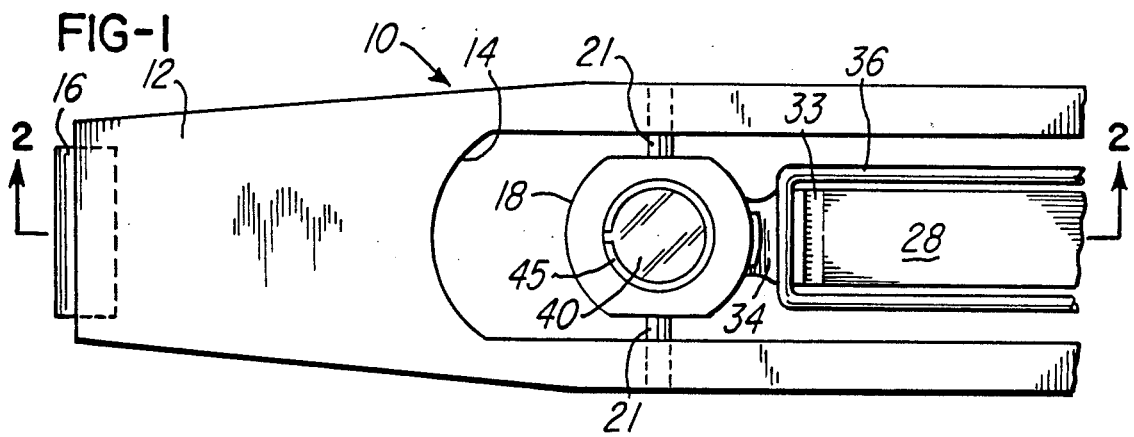
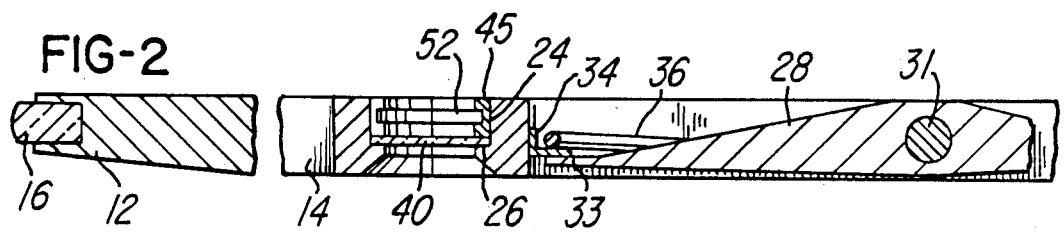
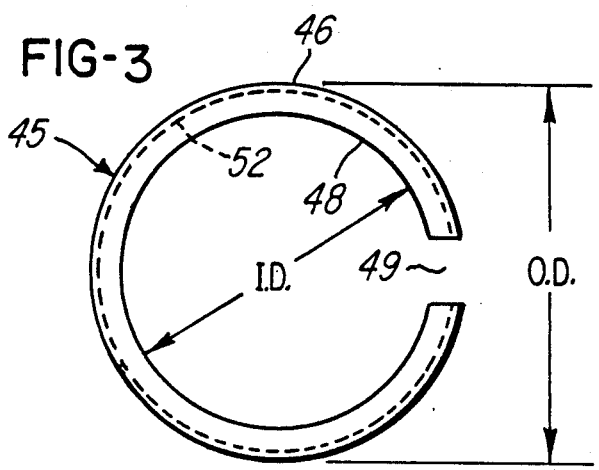
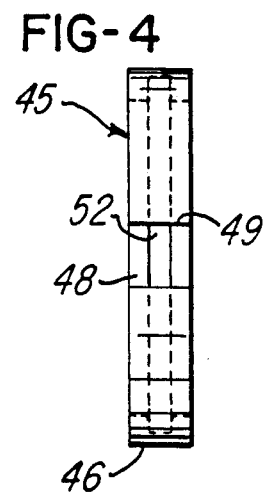
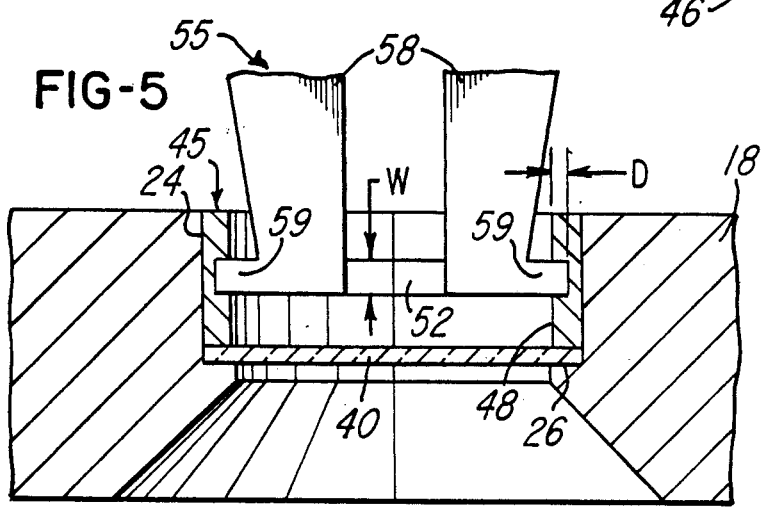

SPECIMEN RETAINING RING SYSTEM FOR AN ELECTRON MICROSCOPE

BACKGROUND OF THE INVENTION

In an electron microscope, for example, of the general type disclosed in U.S. Pat. No. 3,745,341 and No. 4,596,934, the specimen to be inspected is placed on a circular specimen grid, and the grid is positioned within a cylindrical counterbore formed within a movable specimen holder such as shown in FIG. 2 of U.S. Pat. No. 4,596,934. As also shown in this patent, the specimen grid is retained within the counterbore by a C-shaped wire retaining spring or ring which snap-fits into a corresponding internal groove formed within the holder.

When the wire retaining spring or ring is being removed from the mating groove, it is common to use a pair of forceps for gripping the wire ring. However, if the forceps slip on the ring or the ring slips from the forceps, the specimen may be damaged. Furthermore, because of the small size of the wire ring, for example, about ⅛ inch in diameter, it is difficult to determine whether or not the wire ring is properly seated within the mating groove or in the forceps. If the ring is not properly seated, the ring may become dislodged and lost within the microscope column while the holder is being manipulated for orientating the specimen grid. When the ring is lost, it can cause astigmatism, so that the microscope must be disassembled to find the lost ring and then reassembled, resulting in the microscope being out of service for several days.

In an attempt to avoid the above problems, another form of specimen grid retaining system has been used. This system incorporates an externally threaded ring which is threaded into mating threads formed within the specimen grid holder. However, it has been found difficult to obtain a precision retention force on the specimen grid with the use of the threaded ring. If an excessive torque is used on the threaded ring, the specimen grid may be damaged or fractured. In addition, it is not easy to insert the threaded ring and to obtain precision alignment and engagement of the internal and external threads.

SUMMARY OF THE INVENTION

The present invention is directed to an improved retaining ring system for securing a specimen grid within the holder of an electron microscope and which provides for positively retaining a specimen grid and for simplified insertion and removal of the ring. The retaining ring system of the invention also provides for positively gripping the ring in order to eliminate inadvertent release or loss of the ring. In addition, the system of the invention prevents the application of excessive or concentrated forces against the specimen grid to avoid fracturing of the grid or the sample specimen on the grid.

In accordance with one embodiment of the invention, a circular specimen grid is seated on an annular shoulder located at the end of a cylindrical counterbore formed within a specimen grid holder or block. A split cylindrical retaining band or ring has an outer cylindrical surface which mates with the counterbore and an inner cylindrical surface with a circumferentially extending recess or groove. The groove is adapted to receive a pair of mating feet which project outwardly from the spring legs of a tweezers-type tool. The tool positively grips the retaining ring for inserting the ring into the counterbore and for removing the ring from the counterbore when it is desired to remove and replace the specimen grid. The retaining ring of the invention eliminates down time of the microscope due to a lost retaining ring in the microscope column, and is also non-magnetic so that it does not generate astigmatism in the microscope column.

Other features and advantages of the invention will be apparent from the following description, the accompanying drawing and the appended claims.

BRIEF DESCRIPTION OF THE DRAWING

FIG. 1 is an enlarged fragmentary plan view of a specimen holder and supporting a specimen grid secured by a retaining ring system constructed in accordance with the invention;

FIG. 2 is a fragmentary section view taken generally on the line 2-2 of FIG. 1;

FIG. 3 is an axial view of a retaining ring constructed in accordance with the invention;

FIG. 4 is an elevational view of the retaining ring showing FIG. 3; and

FIG. 5 is a greatly enlarged fragmentary section showing the retaining ring of FIGS. 3 and 4 and coupled to a ring insertion and removal tool also constructed in accordance with the invention.

DESCRIPTION OF THE PREFERRED EMBODIMENT

FIG. 1 illustrates a double tilt specimen holder 10 of the type commonly used on electron microscopes manufactured by North American Phillips Company and by other companies. In general, the holder 10 includes a tip portion 12 which defines an opening 14 and which is supported for rotation on a longitudinal axis. A low friction bearing element 16 is supported within a recess within the outer end of the tip portion 12. A specimen support body or block 18 is supported within the opening 14 for pivotal or tilting movement on the axis of a pair of aligned trunions or pivot pins 21. The support block 18 defines a cylindrical counterbore 24 (FIG. 5) which extends from an annular shoulder 26. As an indication of the degree of enlargement shown in FIGS. 1-5, the counterbore 24 has a diameter of about 0.125 inch.

The holder 10 also supports a lever 28 which is supported for pivotal or tilting movement by a cross shaft 31. The lever 28 has a forward end portion 33 which projects under an angle bracket or tab 34 secured to the specimen support block 18. A wire torsion spring 36 extends around the lever 28 and across the top of the bracket 34 to assure that the bracket 34 remains in contact with the forward end portion 33 of the lever 28. By pivoting the lever 28, the specimen support block 18 is pivoted on the axis of the cross shafts or pins 21, and as mentioned above, the entire holder 10 may be rotated on its longitudinal axis so that the block 18 is provided with a double tilt or universal movement.

Referring to FIGS. 2 and 5, a circular specimen grid 40 is positioned within the counterbore 24 and is supported by the annular shoulder 26. The specimen grid 40 carries a sample of the substance which is being inspected in the electron microscope and may be extremely fragile and easily fractured. In accordance with the present invention, the specimen grid 40 is retained within the counterbore 24 by a generally cylindrical retaining band or ring 45 which slides by a light press fit within the counterbore 24 and frictionally engages the block 18.

The retaining ring 45 is preferably machined from brass and has a length of about 0.035 inch and an outer cylindrical surface 46 with an outer diameter O.D. of about 0.125 inch so that it forms a snug fit with the counterbore 24. The ring 45 has a cylindrical inner surface 48 with an inner diameter I.D. of about 0.100 inch and is split by a metal saw to form a space or gap 49. The inner cylindrical surface 48 is interrupted by a circumferentially extending groove 52 having a width W of 0.020 inch and a depth D of 0.010 inch.

As shown in FIG. 5, the retaining band or ring 45 is adapted to receive a carrier and positioning tool 55 constructed in the general form of tweezers and having parallel spaced and spring biased leg portions 58. The two leg portions 58 have corresponding outwardly projecting tabs or feet 59 which fit within diametric portions of the groove 52 to support the retaining ring 45 during insertion and removal.

After the specimen grid 40 is placed within the support block 18 of the holder 10, one end of the retaining band or ring 45 is placed on a solid surface. The leg portions 58 of the tweezers-type insertion tool 55 are inserted into the ring 45. When the feet portion 59 snap outwardly into the groove 52, a positive click noise is heard and is also detected or sensed with the fingers. With the retaining ring 45 locked or secured to the tool 55, the ring 45 is gently inserted into the counterbore 24 of the block 18 until the ring 45 rests on the specimen grid 40. The leg portions 58 are then pressed together to retract the feet portion 58 from the groove 52, and the tool 55 is removed or withdrawn from the retaining ring 45. When it is desired to remove the specimen grid 40, the above procedure is reversed.

From the drawing of the above description, it is apparent that the invention provides an improved specimen retaining ring system for an electron microscope and which substantially eliminates the problems associated with a conventional retaining ring such as disclosed in abovementioned U.S. Pat. No. 4,596,934. For example, the construction of the retaining band or ring 45 with the internal recess or groove 52 for receiving the outwardly projecting feet 59 of the tool 55, provides for positively and precisely gripping the retaining ring 45 during insertion and removal of the retaining ring. As a result, the chance of inadvertently releasing or losing the retaining ring during insertion or removal, is substantially eliminated.

Furthermore, the positive engagement of the tool 55 with the ring 45 enables the user to control and sense the pressure or clamping force exerted by the ring 45 against the specimen grid 40 during installation of the ring. This assures that the specimen will not be damaged and eliminates the substantial time and expense of preparing a new specimen. The positive spring engagement of the feet 59 into the groove 52 also provides an audible "click" in addition to the snap engagement detected or sensed by the fingers so that the user knows when the retaining ring 45 is positively engaged by the tool 55. In addition, the non-magnetic brass retaining ring 45 eliminates any astigmatism problem. As mentioned above, this problem has occurred with a steel wire retaining ring, such as shown in above-mentioned U.S. Pat. No. 4,596,934, when it falls into the column. Furthermore, the brass ring of the invention is more compatable with the brass holder and the energy dispersive X-ray analysis.

While the form of apparatus herein described constitutes a preferred embodiment of the invention, it is to be understood that the invention is not limited to this precise form of apparatus, and that changes may be made therein without departing from the scope and spirit of the invention as defined in the appended claims.

The invention having thus been described, the following is claimed:

1. In a specimen holder assembly for use in an electron microscope and including a specimen grid block defining a generally cylindrical bore extending from an inwardly projecting shoulder for supporting a circular specimen grid, an improved specimen grid retaining ring system comprising a generally cylindrical ring-like body extending into said bore and having an inner surface and an outer surface engaging said grid block, said body being split in an axial direction and being slightly flexible in a radial direction, means defining a recess within said inner surface, a hand tool having spaced relatively movable legs adapted to extend into said body, and said legs including outwardly projecting tip portions adapted to extend into said recess for releasably gripping said body with said tool to facilitate precision insertion and retraction of said body from said bore for removably retaining the specimen grid.

2. A specimen holder assembly as defined in claim 1 wherein said inner and outer surfaces of said body are generally cylindrical, and said recess comprises a circumferentially extending groove within said inner surface.

3. A specimen holder assembly as defined in claim 2 wherein said tip portions have a thickness generally equal to the width of said groove.

4. A specimen holder assembly as defined in claim 1 wherein said hand tool comprises tweezers having connected spring-like said legs, and said legs are depressed together to retract said tip portions from said recess.

5. A specimen holder assembly as defined in claim 1 wherein said inner and outer surfaces of said body are generally cylindrical, said outer surface has a diameter of about 0.125 inch and said inner surface has a diameter of about 0.100 inch.

6. A specimen holder assembly as defined in claim 5 wherein said body has an axial length of about 0.035 inch.

7. A specimen holder assembly as defined in claim 1 wherein said recess comprises a circumferential groove within said inner surface of said body.

8. A specimen holder assembly as defined in claim 7 wherein said groove has a width in an axial direction of about 0.020 inch.

9. A specimen holder assembly as defined in claim 7 wherein said groove has a depth in a radial direction of about 0.010 inch.

10. In a specimen holder assembly for use in an electron microscope and including a specimen grid block defining a cylindrical bore extending from an inwardly projecting annular shoulder for supporting a circular specimen grid, an improved specimen grid retaining ring system comprising a generally cylindrical ring-like body extending into said bore and having an inner cylindrical surface and an outer cylindrical surface engaging said grid block, said body being split in an axial direction and being slightly flexible in a radial direction, means defining a circumferentially extending groove within said inner surface, a tweezers-type hand tool having a pair of spaced movable and spring biased legs adapted to extend into said body, and said legs including outwardly projecting tip portions adapted to extend into said recess for releasably gripping said body with said tool to facilitate precision insertion and retraction of said body from said bore for removably retaining said specimen grid.

11. A specimen holder assembly as defined in claim 10 wherein said tip portions have a thickness generally equal to the width of said groove.

12. A specimen holder assembly as defined in claim 10 wherein said outer surface of said body has a diameter of about 0.125 inch and said inner surface has a diameter of about 0.096 inch, and said body has an axial length of about 0.035 inch.

13. In a specimen holder assembly for use in an electron microscope and including a specimen grid block defining a bore extending from an inwardly projecting annular shoulder for supporting a circular specimen grid, an improved specimen grid retaining ring system comprising a ring-like body extending into said bore and having an inner surface and an outer surface engaging said grid block, said body being split in an axial direction and being slightly flexible in a radial direction, a hand tool having spaced relatively movable legs adapted to extend into said body, and said legs having means for releasably gripping said inner surface of said body to facilitate precision insertion and retraction of said body from said bore for removably retaining the specimen grid.

14. A specimen holder assembly as defined in claim 13 wherein said hand tool comprises tweezers having connected spring-like said legs, and said legs are depressed together to release said gripping means from said body.

15. A specimen holder assembly as defined in claim 13 wherein said inner and outer surfaces of said body are generally cylindrical, said outer surface has a diameter of about 0.125 inch and said inner surface has a diameter of about 0.100.

* * * * *